(12) United States Patent
Roth

(10) Patent No.: US 10,206,279 B2
(45) Date of Patent: Feb. 12, 2019

(54) SUBSTRATE AND MULTIPLE SUBSTRATE, AND METHOD FOR PRODUCING THEREOF

(71) Applicant: Infineon Technologies AG, Neubiberg (DE)

(72) Inventor: Alexander Roth, Zeitlarn (DE)

(73) Assignee: Infineon Technologies AG, Neubiberg (DE)

( * ) Notice: Subject to any disclaimer, the term of this patent is extended or adjusted under 35 U.S.C. 154(b) by 6 days.

(21) Appl. No.: 15/450,813

(22) Filed: Mar. 6, 2017

(65) Prior Publication Data

US 2017/0257945 A1 Sep. 7, 2017

(30) Foreign Application Priority Data

Mar. 7, 2016 (EP) .................................... 16158942

(51) Int. Cl.
| | |
|---|---|
| *H05K 1/03* | (2006.01) |
| *H05K 3/46* | (2006.01) |
| *H05K 1/02* | (2006.01) |
| *H01L 23/544* | (2006.01) |
| *H05K 3/06* | (2006.01) |
| *H01L 23/12* | (2006.01) |

(52) U.S. Cl.
CPC ......... *H05K 1/0306* (2013.01); *H01L 23/544* (2013.01); *H05K 1/0269* (2013.01); *H05K 1/0284* (2013.01); *H05K 3/4644* (2013.01); *H01L 23/12* (2013.01); *H01L 2223/54413* (2013.01); *H01L 2223/54426* (2013.01); *H01L 2223/54433* (2013.01); *H01L 2223/54486* (2013.01); *H05K 3/06* (2013.01); *H05K 2201/0929* (2013.01); *H05K 2201/09145* (2013.01); *H05K 2201/09936* (2013.01); *H05K 2203/107* (2013.01)

(58) Field of Classification Search
CPC ............................. H05K 1/036; H05K 3/4644
See application file for complete search history.

(56) References Cited

U.S. PATENT DOCUMENTS

| | | | |
|---|---|---|---|
| 5,527,620 A | 6/1996 | Schulz-Harder | |
| 5,676,855 A | 10/1997 | Schulz-Harder | |
| 6,365,841 B1 * | 4/2002 | Takigami | ............. H05K 1/0269 174/250 |
| 6,621,010 B2 * | 9/2003 | Sakai | .................... H01L 21/481 174/255 |
| 2008/0164588 A1 | 7/2008 | Lee et al. | |
| 2011/0302753 A1 * | 12/2011 | Shibuya | .................. H01L 22/14 29/25.42 |

(Continued)

FOREIGN PATENT DOCUMENTS

| | | |
|---|---|---|
| CN | 1352588 A | 6/2002 |
| DE | 4004844 C1 | 1/1991 |
| DE | 9310299 U1 | 2/1994 |

(Continued)

*Primary Examiner* — Jeremy C Norris
(74) *Attorney, Agent, or Firm* — Murphy, Bilak & Homiller, PLLC

(57) ABSTRACT

A substrate includes a ceramic layer, a metal layer fixed in a planar manner on a surface side of the ceramic layer and a cutout arranged in an edge region of the metal layer. The cutout in the edge region codes information. A multiple substrate having a plurality of these substrates is also provided, as is a method for producing the substrate.

20 Claims, 1 Drawing Sheet

(56) References Cited

U.S. PATENT DOCUMENTS

2013/0313711 A1   11/2013   Kumagai et al.
2015/0029680 A1*  1/2015   Saito .................... H05K 1/0269
                                                         361/748

FOREIGN PATENT DOCUMENTS

| DE | 4318241 A1 | 12/1994 |
| DE | 4444680 A1 | 6/1996 |
| DE | 19504378 A1 | 8/1996 |
| JP | 04111438 A | 4/1992 |
| WO | 2015055600 A1 | 4/2015 |

* cited by examiner

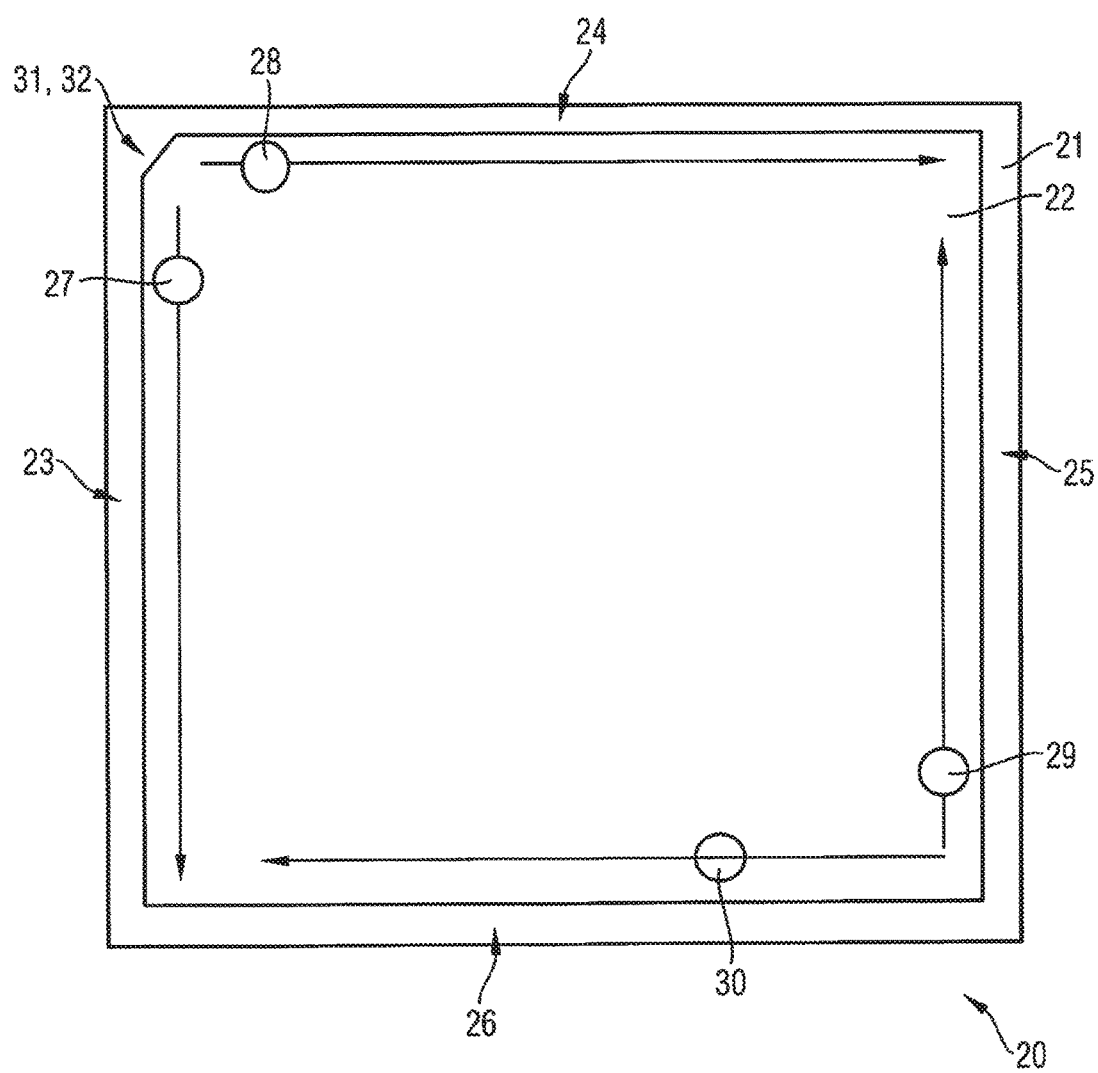

SUBSTRATE AND MULTIPLE SUBSTRATE, AND METHOD FOR PRODUCING THEREOF

PRIORITY CLAIM

This application claims priority to EP Patent Application No. 16158942.9 filed on 7 Mar. 2016, the content of said application incorporated herein by reference in its entirety.

TECHNICAL FIELD

The present invention relates to a substrate, in particular a ceramic substrate, and a method for producing a substrate.

BACKGROUND

It is known to produce substrates, in particular including those comprising an insulating or carrier layer composed of ceramic, for example aluminum oxide ceramic, in a multiple panel, that is to say as a multiple substrate comprising a multiplicity of individual substrates on the common insulating and carrier layer, and also to populate them with electronic components, wherein the multiple substrate is then separated or singulated into the individual substrates for further use. This singulation is carried out, particularly in the case of multiple substrates comprising an insulating and carrier layer composed of ceramic, by cutting, in particular by means of a laser, along cutting lines delimiting the individual substrates and/or breaking along the cutting or predetermined breaking lines.

Such multiple substrates are described for example in DE 195 04 378 A1, DE 44 44 680 A1 and DE 93 10 299 U1.

The ceramic substrates mentioned above are used for producing electrical circuits, in particular power circuits, and are usually provided with a metallization on at least one surface side, said metallization being patterned using an etching technique in such a way that it forms the conductor tracks, contact pads and the like that are required for the circuit.

For efficient fabrication of the electrical circuits it is known to perform the production of these circuits in a multiple panel, that is to say to perform in particular the patterning of the metal surfaces for obtaining the necessary conductor tracks, contact pads and the like, but also the population with the electronic components, on the multiple panel, which is then separated into the respective individual substrates after completion of the patterning and/or population. In the process, however, information concerning the individual substrate is lost, for example the position of the individual substrate in the multiple panel, the manufacturer of the individual substrate, the revision number of the layout and the like, since this information is usually only stored in an edge region of the multiple panel or multiple substrate.

DE 40 04 844 C1 discloses providing holes in a metallization of a ceramic substrate, said holes being produced by etching, in order to avoid large differences in compressive and tensile stress between the ceramic substrate and the metallization applied thereon.

In a similar manner, DE 43 18 241 A1 discloses bringing about a weakening in places in an edge region of a metal layer fixed in a planar manner on an insulating layer, by two series of openings being introduced into the metal layer along said edge region.

SUMMARY

Embodiments described herein provide an improved substrate, in particular an improved ceramic substrate, on which specific information, in particular about the production of said substrate, can be stored in a simple manner durably and at least in a machine-readable fashion, and a method for producing such a substrate. In particular, the storage of the information on the substrate is intended to be able also to be carried out during the processing steps that are to be performed anyway on the substrate, for example during the patterning of a metal layer applied in a planar manner on at least one surface side of the substrate, in order to minimize the outlay for storing the information. Embodiments described herein also provide multiple substrates having these properties.

The features presented individually in the description below can be combined with one another in any technically expedient manner and demonstrate further configurations of the invention. The description additionally characterizes and specifies the invention in particular in association with the figures.

The embodiments described herein can be applied to any type of substrate, for example AlN (aluminum nitride), $Si_3N_4$ (silicon nitride), $Al_2O_3$ (aluminum oxide) and the like, which are coated with a metal layer, for example Cu (copper) or Al (aluminum). In this case, the metallization can be applied on at least one surface side of the substrate by various methods, for example by AMB (active metal brazing), DCB (direct copper bonding), DAB (direct aluminum bonding), thick-film methods and the like. DCB- and AMB-ceramic substrates are particularly preferred in this case. Hereinbelow the term "substrate" is used as a synonym for all types of substrate mentioned above.

According to an embodiment, a substrate comprises a ceramic plate or ceramic layer and at least one metal layer fixed in a planar manner on at least one surface side of the ceramic layer. The metal layer has at least one cutout at at least one edge region. This should be understood to mean that the cutout, in comparison with surface unevenesses for example on account of the surface roughness of the metal layer, constitutes a distinct depression in the metal layer, which depression is essentially sharply delimited with respect to its edge. By way of example, the cutout can be introduced into the metal layer as a depression in the form of a hole which, with regard to its depth, is distinctly delimited from the surrounding surface of the metal layer.

Preferably, the at least one cutout is introduced into the metal layer by etching. In a particularly advantageous manner, this can simultaneously accompany the patterning of the metal layer that is to be performed anyway, such that no additional step is necessary for introducing the cutout into the metal layer on the substrate. In the thick-film method for applying the metallization on at least one surface side of the substrate, this preferably takes place by means of blade coating.

According to an embodiment, the at least one cutout in the edge region of the metal layer codes information. That is to say that by means of the predetermined and non-arbitrary arrangement of the at least one cutout in the edge region of the metal layer desired information to be coded can be unambiguously mapped in said edge region. To put it another way, with the aid of the at least one cutout, information is stored durably in the metal layer, such as, for example, the position or a serial number of the substrate on a multiple substrate, an identifier of the manufacturer of the substrate or a revision number of the patterning layout of the substrate and the like. It goes without saying that other information can likewise be stored on the substrate in this way, for example a date code for the exposure of the substrate by means of a film mask or by means of direct laser exposure, any desired batch number identifying the substrate, or a material number and the like.

The information storage in the metal layer of the substrate enables accurate tracking during all production steps for the substrate manufacturer, for example in the form of a multiple substrate, and also later for the user of the substrate, for example in the form of individual substrates. A further advantage in the use of the cutout in the metal layer is that the information stored thereby in the metal layer is machine-readable and this information can be acquired in a completely automated manner.

In accordance with one advantageous configuration, the information is binary coded, position coded or quaternary coded, in the metal layer by means of the at least one cutout.

In the case of binary coding, the presence of a cutout at a specific position in the edge region of the metal layer corresponds to a logic "1" and a cutout not present at the position corresponds to a logic "0". In order to indicate a start position and/or stop position of a binary code, corresponding additional cutouts can be used at the beginning or end of the binary code.

Alternatively, the information, for example a number, can be stored in the metal layer using position coding. In this case, a specific position of the cutout along the edge region of the metal layer corresponds to a corresponding number, wherein for example a distance of 1 mm along the metal edge can mean an increase/decrease in the corresponding number by 1. The particular advantage of position coding is that the information to be coded can be stored with just one cutout to be introduced into the metal layer.

In the case where a plurality of cutouts can be arranged in two series along the edge region of the metal layer, each position along the metal edge can comprise two cutouts for coding the information, as a result of which four states can be coded per position (quaternary coding). A high information density can be achieved as a result.

Depending on the information to be stored by means of the cutout and the effect additionally provided by the cutout besides its representation of information, for example the properties—explained in the introduction—of a cutout for reducing the thermal cycling stress, in accordance with a further configuration it may be advantageous that the information is negatively coded by means of the at least one cutout. In other words, the absence of a cutout at a specific position in the edge region of the metal layer can then represent a logic "1" and a cutout present can represent a logic "0". In the case of position coding, for example, an absent cutout corresponds to the information to be coded, wherein the multiplicity of cutouts present in the negative position code can then additionally be used for reducing the thermal cycling stress.

A further advantageous configuration provides for the cutout to completely penetrate through the thickness of the metal layer. In other words, the cutout runs in the metal layer from its top side facing away from the substrate surface through to the substrate surface on which the metal layer is applied. The optical contrast when reading the information stored by means of the cutout can advantageously be increased as a result.

In accordance with yet another advantageous configuration, the cutout only partly penetrates into the metal layer, that is to say that the deepest point of the cutout is still situated within the metal layer and does not reach the substrate surface on which the metal layer is applied. In this way, the storage of the information in the metal layer by means of the cutout can be reconciled in part better with existing processing methods (etching methods), such that no additional method steps are required solely for coding the information in the metal layer.

The at least one cutout can be arranged both on the top side of the substrate, provided that a metal layer is applied there, and on the underside of the substrate, provided that a metal layer is applied there.

A further advantageous configuration provides for the cutout to open toward an edge region of the ceramic layer, which edge region faces the edge region of the metal layer in which the at least one cutout is arranged. Preferably, in this case the cutout is introduced into the metal layer as an indentation. Although the cutout produced in this way takes up slightly more space than the cutout etched into the metal layer, the cutout opening toward the substrate edge affords the major advantage that said cutout can be detected, that is to say read, even in a side view of the substrate. In this regard, the information coded by the at least one cutout can be acquired even if a plurality of substrates are stacked one above another in a stack.

In accordance with yet another advantageous configuration, the metal layer furthermore has an alignment indicator, which enables an unambiguous alignment of the substrate. Particularly in the case where a plurality of items of information are coded along different edge regions of the metal layer, a reliable and unambiguous alignment of the substrate before the reading of the stored information is indispensable. This is made possible with the aid of the alignment indicator introduced into the metal layer for example by etching.

Preferably, the alignment indicator can be formed for example at a corner of the metal layer as a triangular recess in the metal layer.

In accordance with another embodiment, provision is made of a multiple substrate comprising a ceramic plate or ceramic layer which forms at least two individual substrates which are adjacent to one another and integrally connected to one another and which in turn are delimited from one another by at least one cutting line running between the individual substrates. Cutting line here should be understood to mean such a line along which the multiple substrate is cut and/or broken in a later singulation step, in order to separate the individual substrates from one another. The individual substrates here are advantageously embodied in each case according to one of the configurations described above. The advantages and effects of such a multiple substrate are directly evident from the already described advantages and effects of the individual substrate and thus analogously also apply to the multiple substrate.

In accordance with yet another embodiment, a method for producing a substrate comprises: providing a ceramic plate or ceramic layer; fixing at least one metal layer in a planar manner on at least one surface side of the ceramic layer; and introducing at least one cutout at an edge region of the metal layer in such a way that the at least one cutout in the edge region codes information.

Preferably, the at least one metal layer can be applied on the substrate surface and fixed thereto in a planar manner according to any of the coating methods already presented above.

According to an embodiment, the introduction of the at least one cutout in the edge region of the metal layer is carried out in a predetermined and non-arbitrary manner such that, with the aid of the specific arrangement of the at least one cutout in the edge region of the metal layer, desired information to be coded is unambiguously mapped in said edge region. The mapping of the information by means of the at least one cutout can in this case be binary coded, position coded and/or quaternary coded, for example.

With regard to the remaining definitions, effects and advantages in association with the method for producing the substrate as disclosed herein, reference is made to the above description of the substrate, which is intended analogously also to apply to the method.

In accordance with one advantageous configuration of the method, introducing the at least one cutout into the metal layer comprises an exposure step for phototechnologically patterning the metal layer, in which at least the arrangement of the at least one cutout on the metal layer is carried out by means of direct laser exposure. In contrast to exposure with the aid of static film masks direct laser exposure affords the major advantage, inter alia, that at least the arrangement of the at least one cutout on the metal layer can be carried out dynamically. Consequently, varying items of information that are different from substrate to substrate can be "written" into the metal layer by means of the at least one cutout, which affords considerable advantages in terms of production engineering.

The actual introduction of the cutout into the metal layer can then be carried out by conventional etching, as already described above.

Those skilled in the art will recognize additional features and advantages upon reading the following detailed description, and upon viewing the accompanying drawings.

BRIEF DESCRIPTION OF THE FIGURE

Further features and advantages will become apparent from the following description of an exemplary embodiment—to be understood as non-restrictive—of the invention, which will be explained in greater detail below with reference to the drawing. In said drawing, schematically:

FIG. 1 shows a plan view of one exemplary embodiment of a substrate.

DETAILED DESCRIPTION

FIG. 1 illustrates a plan view of one exemplary embodiment of a substrate 20. The substrate 20 shown comprises a ceramic plate or ceramic layer 21 and at least one metal layer 22 fixed in a planar manner on at least one surface side of the ceramic layer 21. The top side of the substrate 20 is illustrated in FIG. 1. It should be understood that the underside of the substrate 20, which is not illustrated in FIG. 1, can likewise have a metal layer.

Although only one substrate 20 is illustrated in FIG. 1, it should be understood that the substrate 20 in accordance with this embodiment prior to singulation may have been part of a multiple substrate (not illustrated) whose ceramic layer formed a plurality of (individual) substrates 20 adjacent to one another and integrally connected to one another, which were delimited from one another by at least one cutting line running between the individual substrates 20. Along said cutting lines running along the edges of the ceramic layer 21 of the substrate 20, the individual substrates 20 have been cut and/or broken by means of a laser, for example, in order to obtain the substrate 20 illustrated in FIG. 1.

The exemplary embodiment of the substrate 20 as illustrated in FIG. 1 has a rectangular, here square, shape. The metal layer 22 comprises four edge regions 23, 24, 25 and 26. As can furthermore be gathered from FIG. 1, for each edge region 23, 24, 25 and 26 a respective cutout 27, 28, 29 and 30 can be discerned, which was introduced into the metal layer 22. In each edge region 23, 24, 25 and 26, the cutout 27, 28, 29 and 30 respectively arranged therein codes respective information concerning the substrate 20. In other words, in the exemplary embodiment of the substrate 20 as shown in FIG. 1, a total of four different items of information are stored in the metal layer 22 applied on the top side of the substrate 20.

In the case of the substrate 20, the cutouts 27, 28, 29 and 30 have been introduced into the metal layer 22 in each case by etching. In particular, the cutouts 27, 28, 29 and 30 illustrated in FIG. 1 have been etched completely through the metal layer 22, such that the deepest point of each cutout 27, 28, 29 and 30 extends in each case as far as the ceramic layer 21 (substrate surface), in order to obtain a high optical contrast for good identification of the cutouts 27, 28, 29 and 30.

In the case of the substrate 20 shown in FIG. 1, the information coded and stored in the edge region 23 by means of the cutout 27 represents a row position which the substrate 20 had on the abovementioned multiple substrate prior to singulation. In the edge region 24, the cutout 28 represents a column position of the substrate 20 that was correspondingly occupied on the multiple substrate. In this exemplary embodiment, both items of information are position coded, that is to say that the position of the respective cutout 27 and 28 along the arrow direction—illustrated in FIG. 1—of the corresponding edge region 23 and 24 proceeding from an upper left corner 31 of the metal layer 22 represents the row number and column number, respectively, of the substrate 20 in the multiple substrate wherein an increment of 1 mm of the corresponding cutout 27 and 28 respectively per row and column on the multiple substrate is stipulated in the case of the illustrated exemplary embodiment of the substrate 20.

In the edge region 25 of the metal layer 22, a revision number of the patterning layout (not illustrated) applied on the metal layer, for example a date code of a film mask is coded by means of the cutout 29.

In the edge region 26 of the metal layer 22, the cutout 30 codes an identifier of the manufacturer of the substrate 20, wherein for example one cutout 30 represents a first manufacturer, two cutouts 30 arranged in the edge region 26 represent a second manufacturer, etc.

As can furthermore be discerned in FIG. 1, the upper left corner 31 of the metal layer 22 is embodied as an alignment indicator 32 which enables an unambiguous alignment of the substrate 20 for the unambiguous acquisition of the information coded in the plurality of edge regions 23, 24, 25 and 26 of the metal layer 22. Said alignment indicator 32, too, is preferably introduced into the metal layer by etching. In the case of the substrate 20 illustrated in FIG. 1, the alignment indicator 32 is formed in the corner 31 of the metal layer 22 as a triangular recess. Other suitable (geometrical) shapes of the alignment indictor 32 which enable an unambiguous alignment of the substrate 20 are conceivable.

The above-described substrate, the multiple substrate and also the production method are not restricted to the embodiment disclosed herein, but rather also encompass identically acting further embodiments.

In a preferred embodiment, the substrate, in particular a ceramic substrate, comprising a metal layer, for example copper or aluminum, applied on at least one surface side of the ceramic substrate is used for producing electrical circuits, in particular power circuits, wherein at least one cutout for coding information is introduced in the metal layer.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

LIST OF REFERENCE SIGNS

20 Substrate
21 Ceramic plate or ceramic layer
22 Metal layer
23 Edge region
24 Edge region
25 Edge region
26 Edge region
27 Cutout
28 Cutout
29 Cutout
30 Cutout
31 Corner
32 Alignment indicator

What is claimed is:

1. A substrate, comprising:
a ceramic layer;
a metal layer fixed in a planar manner on a substantial portion of a surface side of the ceramic layer, the metal layer comprising copper or aluminum; and
a cutout arranged in an edge region of the metal layer, wherein the cutout in the edge region codes information, wherein a surface of the metal layer facing away from the ceramic layer forms a surface of the substrate.

2. The substrate of claim 1, wherein the information is binary coded, position coded or quaternary coded by means of the cutout.

3. The substrate of claim 1, wherein the information is negatively coded by means of the cutout.

4. The substrate of claim 1, wherein the cutout completely penetrates through the thickness of the metal layer.

5. The substrate of claim 1, wherein the cutout partly penetrates into the metal layer.

6. The substrate of claim 1, wherein the cutout opens toward an edge region of the ceramic layer, and wherein the edge region of the ceramic layer faces the edge region of the metal layer in which the cutout is arranged.

7. The substrate of claim 1, wherein the metal layer comprises an alignment indicator separate from the cutout and which enables alignment of the substrate.

8. The substrate of claim 7, wherein the alignment indicator is formed at a corner of the metal layer as a triangular recess in the metal layer.

9. A multiple substrate, comprising:
a ceramic layer which forms at least two individual substrates which are adjacent to one another and integrally connected to one another and which are delimited from one another by at least one cutting line running between the at least two individual substrates,
wherein each of the at least two individual substrates comprises a ceramic layer, a metal layer fixed in a planar manner on a substantial portion of a surface side of the ceramic layer, and a cutout arranged in an edge region of the metal layer, wherein the cutout in the edge region codes information, wherein the metal layer comprises copper or aluminium, and wherein a surface of the metal layer facing away from the ceramic layer forms a surface of the substrate.

10. The multiple substrate of claim 9, wherein the information is binary coded, position coded or quaternary coded by means of each cutout.

11. The multiple substrate of claim 9, wherein the information is negatively coded by means of each cutout.

12. The multiple substrate of claim 9, wherein each cutout completely penetrates through the thickness of the metal layer in which the cutout is arranged.

13. The multiple substrate of claim 9, wherein each cutout partly penetrates into the metal layer in which the cutout is arranged.

14. The multiple substrate of claim 9, wherein each cutout opens toward an edge region of the ceramic layer to which the metal layer having the cutout is fixed, and wherein the edge region of the ceramic layer faces the edge region of the metal layer in which the cutout is arranged.

15. The multiple substrate of claim 9, wherein each metal layer comprises an alignment indicator separate from the cutout and which enables alignment of the corresponding substrate.

16. The multiple substrate of claim 15, wherein each alignment indicator is formed at a corner of the corresponding metal layer as a triangular recess in the metal layer.

17. A method for producing a substrate, the method comprising:
providing a ceramic layer;
fixing a metal layer in a planar manner on a substantial portion of a surface side of the ceramic layer, the metal layer comprising copper or aluminum; and
forming a cutout in an edge region of the metal layer in such a way that the cutout in the edge region codes information,
wherein a surface of the metal layer facing away from the ceramic layer forms a surface of the substrate.

18. The method of claim 17, wherein forming the cutout in the edge region of the metal layer comprises phototechnologically patterning the metal layer, in which an arrangement of the cutout on the metal layer is performed by direct laser exposure.

19. The method of claim 17, further comprising:
forming an alignment indicator separate from the cutout in the metal layer and which enables alignment of the substrate.

20. The method of claim 19, wherein forming the alignment indicator in the metal layer comprises forming a triangular recess in a corner of the metal layer.

* * * * *